United States Patent [19]
Garneyer et al.

[11] Patent Number: 5,714,728
[45] Date of Patent: Feb. 3, 1998

[54] ELECTRIC SWITCH

[75] Inventors: Stefan Garneyer, Lüdenscheid; Kersten Rimke, Herscheid; Michael Bieling, Menden, all of Germany

[73] Assignee: Leopold Kostal GmbH & Co. KG, Germany

[21] Appl. No.: 635,558

[22] Filed: Apr. 22, 1996

[30] Foreign Application Priority Data

Apr. 21, 1995 [DE] Germany .......... 195 14 708

[51] Int. Cl.$^6$ .................. H01H 35/32
[52] U.S. Cl. .......... 200/81.5; 200/82 E; 335/207; 338/32 H
[58] Field of Search .......... 307/118; 73/313, 73/861.47; 338/32 H; 340/626, 551; 335/205–207; 361/600, 601, 605, 837; 200/318.1, 61.45 M, 5 R, 81.4, 81.5, 84 C, 82 E, 83 L, 81.9 M, 51 R, 17 R, 18, 329

[56] References Cited

U.S. PATENT DOCUMENTS

| | | | |
|---|---|---|---|
| 3,736,397 | 5/1973 | Pedersen | 200/5 R |
| 3,845,258 | 10/1974 | Bruels | 200/81.5 |
| 4,266,517 | 5/1981 | Sakakibara | 200/81.5 |
| 4,581,941 | 4/1986 | Obermann | 73/728 |
| 4,691,185 | 9/1987 | Loubier | 338/32 H |
| 5,024,294 | 6/1991 | Van Fossem | 184/108 |

FOREIGN PATENT DOCUMENTS

| | | | |
|---|---|---|---|
| 3333497 | 4/1985 | Germany . | |
| 3337122C2 | 2/1990 | Germany . | |
| 4119316 | 9/1992 | Germany . | |
| 2226450 | 6/1990 | United Kingdom | 200/81.5 |

Primary Examiner—Gerald P. Tolin
Attorney, Agent, or Firm—Brooks & Kushman P.C.

[57] ABSTRACT

Electrical switch gear which comprises a housing formed to be substantially rotationally symmetrical and consisting of an upper housing part and a lower housing part. Inside the housing is disposed an actuating member formed as a push rod, provided in a housing chamber and provided with a permanently magnetized component, and a switching component which can be influenced by the permanently magnetized component and is provided in one housing chamber hermetically separated from the other housing chamber. To create switching gear able to make possible a larger number of switching functions, at least one permanently magnetized component is provided which is disposed on one longitudinal side of the actuating member and extends with its region of action close to one of the separating wall sides extending in the displacement direction of the actuating member. In addition to the one switching component provided on the other separating wall side, at least one further switching component is provided in the other housing chamber and is located in front of or behind the one switching component in the displacement direction of the actuating member.

13 Claims, 2 Drawing Sheets

ELECTRIC SWITCH

TECHNICAL FIELD

The present invention relates to an electric switch provided with a multi-part housing.

BACKGROUND ART

Certain electrical switches—in particular those using the Hall effect—are provided in order precisely to switch on and off an electric circuit with the lowest possible switching hysteresis. Such switches are provided, for example, for the most widely differing operational regions in motor vehicles and are, for example, used as brake light switches, gear switches etc.

DE 33 33 497 A1 discloses electric switch, wherein two permanently magnetized components are disposed in a housing comprised of a plurality of parts, their poles comprising the same polarization, are disposed oppositely and spaced apart. Between these poles of the two permanently magnetized components, a Hall effect switching component is disposed. The first permanently magnetized component is thus fixed to the actuating member of the switch, while the second permanently magnetized component is held in an adjustable manner on the housing. The spacing between the second permanently magnetized component and the Hall effect switching component is set in this electric switch by means of an adjusting means, wherein the second permanent magnet is fixed directly on the adjusting means. In a device formed in this way the two permanently magnetized components, the Hall effect switching component, and the holding means provided therefor are subjected to all the environmental conditions prevailing in the housing. Under aggressive environmental influences the Hall effect switching component and the associated holding means may deteriorate with respect to their operational capability. This can eventually lead to the failure of the electric switch.

DE 33 37 122 C2 also discloses an electric switch which consists of an actuating member formed as a push button and held in a longitudinally adjustable manner in an upper housing part and of a movable switching member disposed in a lower housing part and formed from a switching mat. A nonmovable switching member is disposed on an insulating material plate held on the lower part of the housing. The switching members are formed from different electrode layers. By the division of the housing into an upper housing part and a lower housing part and the arrangement of the switching mat and of the actuating member a spatial separation of the actuating member and switching members is produced.

DE 41 19 316 C1 also discloses an electric switch in which in a housing consisting of a number of parts, two housing chambers are provided hermetically separated from each other and formed by a separating wall provided on the housing. A permanently magnetized component is thus allocated to the actuating member of the switch disposed in one housing chamber, while in the other housing chamber, a Hall effect switching component which can be influenced by the permanently magnetized component is provided. The permanently magnetized component and the switching component are thus allocated to the two sides of the separating wall and arranged opposite each other.

In all the aforementioned embodiments the problem exists that only one electric switching function (on/off) is possible.

SUMMARY OF THE INVENTION

It is therefore the aim of the present invention to develop an electric switch that provides a number of associated switching functions.

This object is achieved by the features stated in the characterizing part of the main claim. An electric switch formed in this way is particularly advantageous in that it comprises only relatively few mechanically operated parts. Such a product is particularly resistant to wear so that high numbers of position changes can be reliably achieved.

BRIEF DESCRIPTION OF THE DRAWINGS

Further particularly favorable embodiments of the subject matter in accordance with the invention are given in the sub claims and described in more detail with the aid of an embodiment illustrated in the drawings, in which:

BEST MODE FOR CARRYING OUT THE INVENTION

Figure 1:
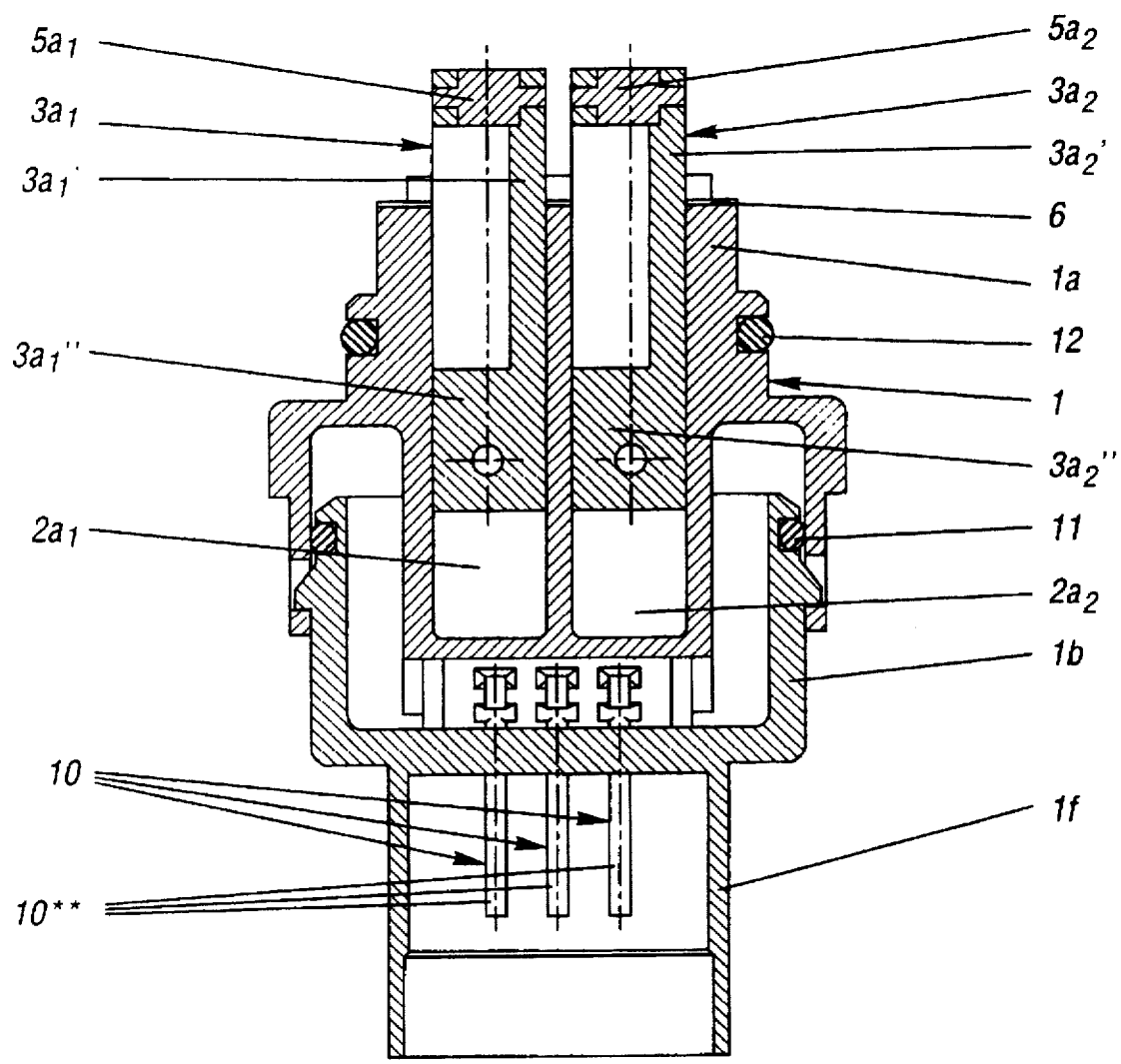
FIG. 1 illustrates a longitudinal sectional view along the line A—A of FIG. 2 of the electric switch.
Figure 2:
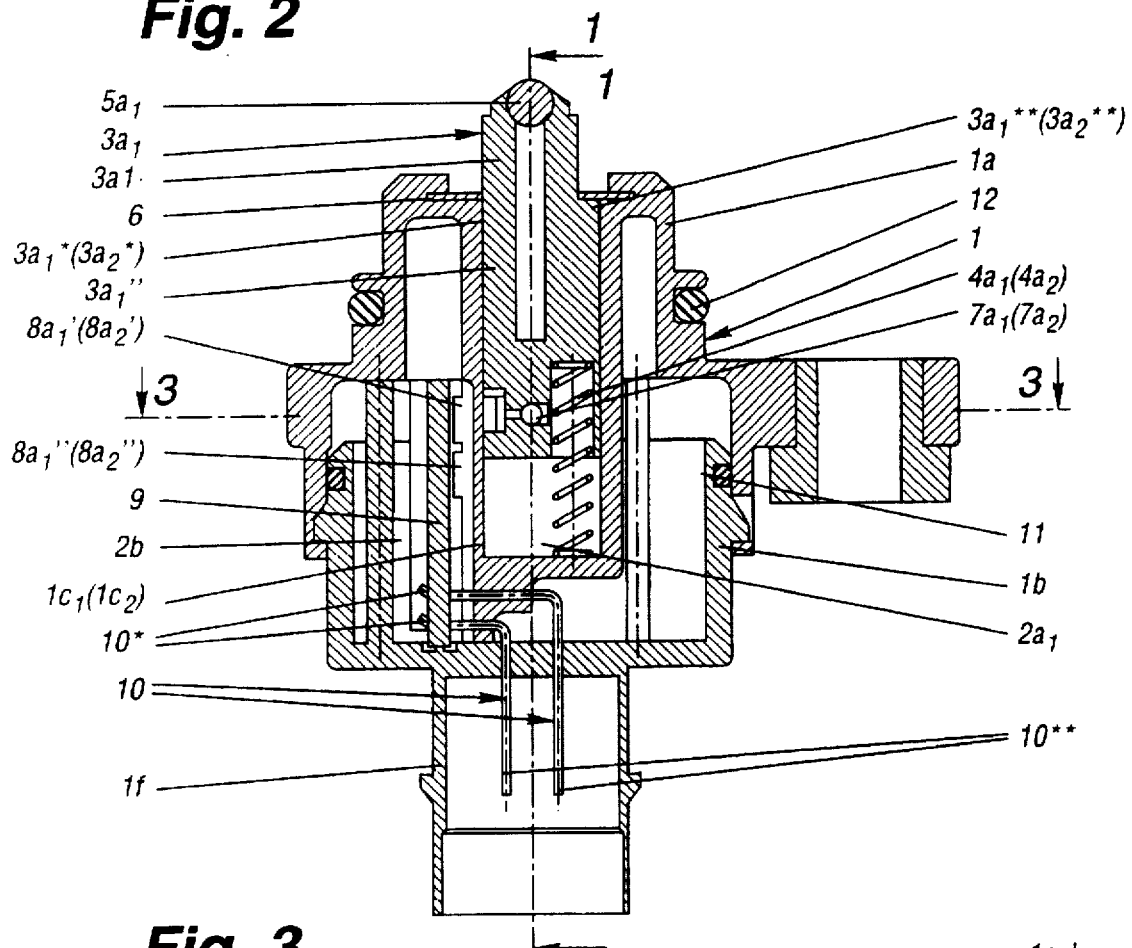
FIG. 2 illustrates a longitudinal sectional view along the line B—B of FIG. 3 of the electric switch in accordance with FIG. 1.
Figure 3:
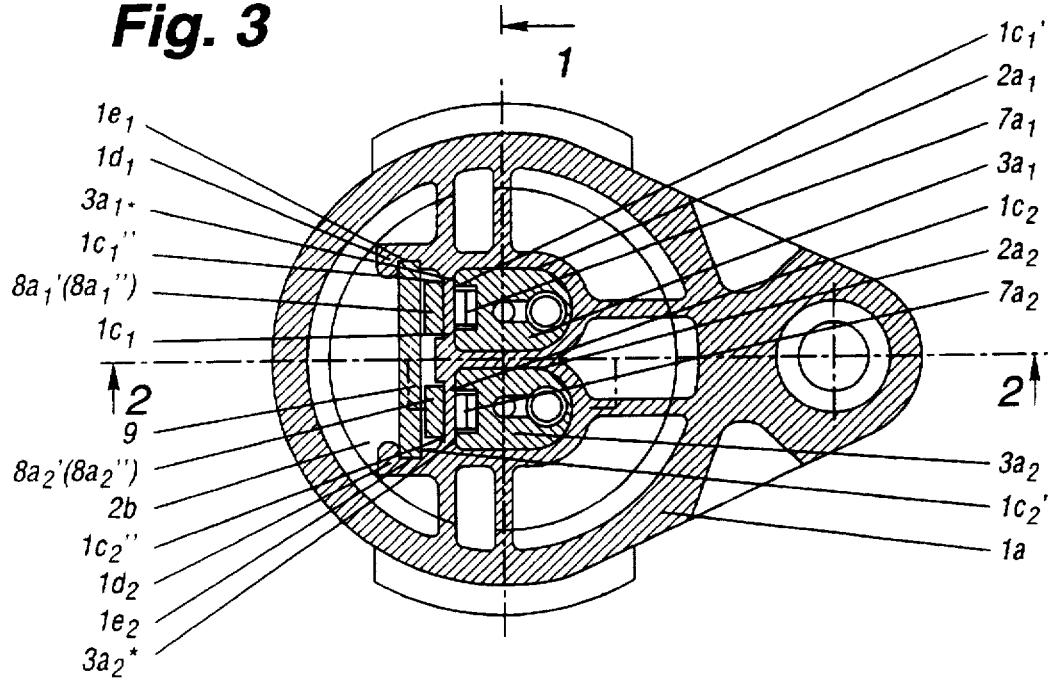
FIG. 3 illustrates a transverse sectional view along line C—C of FIG. 2 of the electric switch in accordance with FIGS. 1 and 2.

As is evident from the drawings, an electric switch in accordance with the invention comprises a substantially rotationally symmetrical multi-part housing 1 consisting of an upper housing part 1a and a lower housing part 1b. In the upper housing part 1a are disposed two actuating members $3a_1$, $3a_2$ in two housing chambers $2a_2$, $2a_2$ provided there. These actuating members $3a_1$, $3a_2$ are each supported against the chamber floor with one of their end regions $3a_1"$, $3a_2"$ by a resilient element $4a_1$, $4a_2$ formed as a helical compression spring, while they protrude with their other (free) end region $3a_1'$, $3a_2'$ out of the associated housing chamber $2a_1$, $2a_2$ on the side of the upper housing part 1a remote from the lower housing part 1b. In order that the actuating members $3a_1$, $3a_2$ which can be influenced, for example, by a cam-shaped operating means, do not fall out of the associated housing chamber $2a_1$, $2a_2$ holding element 6 is allocated to them and partially closes the housing chambers in such a way that only the narrowed free end regions $3a_1$, $3a_2$ of the actuating members protrude out of the associated housing chamber, while the other end regions $3a_1"$, $3a_2"$ the actuating members located in each housing chamber is supported against the holding element by a shoulder-like projection $3a_1$, $3a_2$ by reason of the force applied by each associated resilient element $4a_1$, $4a_2$.

At the outermost end of the end regions $3a_1'$, $3a_2'$ of each of the two actuating members protruding out of the housing chambers $2a_1$, $2a_2$ is attached a roller-shaped displacement element $5a_1$, $5a_2$ in order to render possible problem-free actuation of the actuating members $3a_1$, $3a_2$ by the associated cam-shaped operating means.

Close to the end regions $3a_1"$, $3a_2"$ of the actuating members $3a_1$, $3a_2$ comprising a rectangular cross section, lying in each housing chamber $2a_1$, $2a_2$ a permanently magnetized component $7a_1$, $7a_2$ is inserted at each longitudinal side of the actuating members in such a way that it is disposed with its element of magnetic action (magnetic pole surface) parallel to and very slightly spaced from the one side $1c_1'$, $1c_2'$ of the separating wall $1c_1$, $1c_2$.

On the other side $1c_1"$, $1c_2"$ of the separating wall two switching components $8a_1'$, $8a_1"$; $8a_2'$, $8a_2"$ preferably using the Hall effect and which can be influenced by the permanently magnetized components $7a_1$, $7a_2$ provided on the two actuating members $3a_1$, $3a_2$ are disposed in a respective housing chamber $2b$ formed by the assembly of the upper housing part $1a$ and lower housing part $1b$. These switching components $8a_1'$, $8a_1''$; $8a_2'$ are disposed one behind the other in pairs in the displacement direction of each of the two actuating members $3a_1$, $3a_2$ and therefore with the displacement of each actuating member come into the region of influence of the associated permanently magnetized components $7a_1$, $7a_2$.

Both switching components $8a_1'$, $8a_1''$; $8a_2'$, $8a_2''$ allocated to a respective actuating member $3a_1$, $3a_2$ are fixed on a printed circuit board 9 which may be fitted with electronic components, the circuit board being held in oppositely lying guide grooves $1e_1$, $1e_a$ which are provided on housing wall portions $1d_1$, $1d_2$ formed on the upper housing part $1a$ and provided in the housing chamber $2b$. The tracks provided on the printed circuit board 9 and electrically connected to the switching components $8a_1'$, $8a_1''$; $8a_2'$, $8a_2''$ are connected to connection ends 10* which are provided on contact parts 10 of which the other ends 10** are formed as outwardly directed plug contact elements surrounded by a housing collar $1f$.

Because a such switch can be used, for example, as a so-called shifter, the housing 1 must, on the one hand, be formed in such a way that oil located in the transmission cannot penetrate into the housing chamber $2b$, i.e. into the inner chamber fitted with the electrical components. To this end a surrounding annular sealing means 11 is disposed between the mutually cooperating hollow cylindrical regions of the upper housing part $1a$ and the lower housing part $1b$. A further sealing means 12 provided on the upper housing part $1a$ prevents oil moving outward from the inner chamber of a transmission and in particular penetrating between the outer wall of the upper housing part $1a$ and the inner wall of an aperture provided to receive the housing.

The operation of the above-described switch will now be explained in more detail by reference to the operation of an actuating member.

In the rest position, illustrated in FIG. 1, of (one) actuating member $3a_1$ one of the switching components $8a_1'$ is located in the region of influence of the permanently magnetized component $7a_1$ provided on the actuating member $3a_1$ and is therefore in its conducting state, while the other switching component $8a_1''$ removed from the permanently magnetized component $7a_1$ is in its blocked state. These two switching states of the two switching components $8a_1'$, $8a_1''$ remain throughout a first displacement region of the actuating member $3a_1$, dependent upon the formation and arrangement of the permanently magnetized component $7a_1$ and its allocation to one of the switching components.

In a further displacement of the actuating member $3a_1$ beyond the first displacement region the one switching component $8a_1'$ passes into its blocked state while the other switching component $8a_1''$ retains its blocked state.

These switching states of the two switching components $8a_1'$, $8a''$ are maintained throughout a second (middle) region defined by the distance between the two switching components. Upon leaving the middle region and entering a third region the other switching component $8a_1''$ passes into its conducting state, while the one switching component $8a_1'$ retains its blocked switching state. These states of the two switching components $8a_1'$, $8a_1''$ then remain until the end $3a_1''$ of the actuating member $3a_1$ stops against the chamber floor and when the actuating member returns to its rest position corresponding changes of state take place for the two switching functions allocated to the switching components.

If the second actuating member $3a_2$ is constructed in exactly the same way with respect to its permanently magnetized component $7a_2$ and the switching components $8a_2'$, $8a_2''$ are disposed in exactly the same way and therefore allocated accordingly, corresponding dependent control is made possible by different operation of the cam-like operating means cooperating therewith. Even greater degrees of freedom are achieved when the switching components $8a_1'$, $8a_1''$; $8a_2'$, $8a_2''$ are differently allocated to the actuating members $3a_1$, $3a_2$ or when to each actuating member more than two consecutively arranged switching components or permanently magnetized components are allocated.

What is claimed is:

1. An electric switch comprising:

a multi-part housing (1) having longitudinally extending first and second housing chambers ($2a_1$, $2a_2$) hermetically separated from a longitudinally extending second housing chamber ($2b$) by separating walls ($1c_1$, $1c_1$);

a first actuating member ($3a_1$) being disposed in the first housing chamber ($2a_1$) so as to be displaceable along its longitudinal axis;

a first permanently magnetized component ($7a_1$) having a magnetic pole surface, the first permanently magnetized component ($7a_1$) being disposed on a longitudinal side ($3a_1$*) of the first actuating member ($3a_1$) extending along the displacement direction of the first actuating member ($3a_1$) with the magnetic pole surface substantially parallel to and substantially near a side ($1c_1'$) of the separating wall ($1c_1$);

a first switching component ($8a_1'$) being provided in the second housing chamber ($2b$) substantially near a side ($1c_1''$) of the separating wall ($1c_1$) in the displacement direction of the first actuating member ($3a_1$); and a second switching component ($8a_1'$) being provided in the second housing chamber ($2b$) adjacent the first switching component ($8a_1'$) substantially near the side ($1c_1''$) of the separating wall ($1c_1$) in the displacement direction of the first actuating member ($3a_1$);

wherein the first and second switching components ($8a_1'$, $8a_1''$) are cooperable with the first actuating member ($3a_1$) to be influenced by the first permanently magnetized component ($7a_1$) as a function of the position of the first actuating member ($3a_1$) in the first housing chamber ($2a_1$) such that the first and second switching components ($8a_1'$, $8a_1''$) provide a plurality of switching states.

2. The electric switch according to claim 1 further comprising:

a second actuating member ($3a_2$) being disposed parallel to the first actuating member ($3a_1$) in the second housing chamber ($2a_2$) so as to be displaceable along its longitudinal axis;

a second permanently magnetized component ($7a_2$) having a magnetic pole surface, the second permanently magnetized component ($7a_2$) being disposed on a longitudinal side ($3a_2$*) of the second actuating member ($3a_2$) extending along the displacement direction of the second actuating member ($3a_2$) with the magnetic pole surface substantially parallel to and substantially near a side ($1c_2'$) of the separating wall ($1c_2$);

a third switching component ($8a_2'$) being provided in the second housing chamber ($2b$) substantially near a side ($1c_2''$) of the separating wall ($1c_2$) in the displacement direction of the second actuating member ($3a_2$); and a fourth switching component ($8a_2''$) being provided in the second housing chamber ($2b$) adjacent the third switching component ($8a_2'$) substantially near the side ($1c_2''$) of the separating wall ($1c_2$) in the displacement direction of the actuating member ($3a_2$);

wherein the third and fourth switching components ($8a_2'$, $8a_2''$) are cooperable with the second actuating member ($3a_2$) to be influenced by the second permanently magnetized component ($7a_2$) as a function of the position of the second actuating member ($3a_2$) in the second housing chamber ($2a_2$) such that the third and fourth switching components ($8a_2'$, $8a_2''$) provide a plurality of switching states.

3. The electric switch according to claim 2, wherein:

each actuating member ($3a_1$, $3a_2$) and each switching component ($8a_1'$, $8a_1''$ and $8a_2'$, $8a_2''$) is disposed in one of the housing chambers ($2a_1$, $2a_2$, and $2b$).

4. The electric switch according to claim 1, wherein:

the switching components ($8a_1$, $8a_1''$; $8a_2'$, $8a_2'$) are disposed on an electric printed circuit board (9) which is held in guide grooves ($1e_1$, $1e_2$) provided in housing wall portions ($1d_1$, $1d_2$) of the separating wall ($1c_1$, $1c_2$) and extending parallel to the separating wall ($1c_1$, $1c_2$).

5. The electric switch according to claim 4, wherein:

the tracks of the printed circuit board (9) are connected to contact parts (10) extending out of the housing (1).

6. The electric switch according to claim 5, wherein:

the ends (10**) of the contact parts (10) extending out of the housing (1) are formed as plug contact elements and surrounded by a housing collar ($1f$).

7. The electric switch according to claim 1, wherein:

the housing (1) consists substantially of an upper housing part ($1a$) and a lower housing part ($1b$);

in the upper housing part one of the housing chambers ($2a_1$, $2a_2$) is provided; and the housing chamber ($2b$) is formed by joining the upper housing part and the lower housing part.

8. The electric switch according to claim 7, wherein:

the upper housing part ($1a$) and the lower housing part ($1b$) are provided with hollow cylindrical mutually cooperating end regions which are fitted to each other by means of a surrounding annular sealing means (11).

9. The electric switch according to claim 7, wherein:

the housing wall portions ($1d_1$, $1d_2$) comprising the guide grooves ($1e_1$, $1e_2$) are provided on the upper housing part ($1a$).

10. The electric switch according to claim 1, wherein:

the switching components are formed as switching members using the Hall effect.

11. The electric switch according to claim 7 further comprising:

a first resilient element ($4a_1$) cooperable with the housing chamber ($2a_1$) to support the first actuating member ($3a_1$) in the housing chamber ($2a_1$).

12. The electric switch according to claim 7 further comprising:

a holding element (6) operable with the housing chamber ($2a_1$) to secure the first actuating member ($3a_1$) by partially closing the housing chamber.

13. The electric switch according to claim 7, wherein:

the first actuating member ($3a_1$) has a free end region ($3a_1'$) protruding out of the housing chamber ($2a_1$).

\* \* \* \* \*